(12) United States Patent
Passlack et al.

(10) Patent No.: US 6,756,320 B2
(45) Date of Patent: Jun. 29, 2004

(54) METHOD OF FORMING ARTICLE COMPRISING AN OXIDE LAYER ON A GAAS-BASED SEMICONDUCTOR STRUCTURE

(75) Inventors: Matthias Passlack, Chandler, AZ (US); Nicholas William Medendorp, Jr., Goleta, CA (US)

(73) Assignee: Freescale Semiconductor, Inc., Schaumburg, IL (US)

( * ) Notice: Subject to any disclaimer, the term of this patent is extended or adjusted under 35 U.S.C. 154(b) by 0 days.

(21) Appl. No.: 10/051,494

(22) Filed: Jan. 18, 2002

(65) Prior Publication Data

US 2003/0137018 A1 Jul. 24, 2003

(51) Int. Cl.[7] .............................................. H01L 21/31
(52) U.S. Cl. ....................... 438/763; 438/287; 438/591
(58) Field of Search ................................ 438/287, 591, 438/763, FOR 202, FOR 396, FOR 489, 285, 216, 779, FOR 156

(56) References Cited

U.S. PATENT DOCUMENTS

| | | | | |
|---|---|---|---|---|
| 5,597,768 A | * | 1/1997 | Passlack et al. | ............ 438/779 |
| 5,665,658 A | * | 9/1997 | Passlack | ..................... 438/763 |
| 5,902,130 A | * | 5/1999 | Passlack et al. | ............ 438/604 |
| 5,903,037 A | * | 5/1999 | Cho et al. | ..................... 257/410 |
| 5,962,883 A | * | 10/1999 | Hong et al. | ................. 257/289 |
| 6,271,069 B1 | * | 8/2001 | Chen et al. | ................. 438/204 |
| 6,469,357 B1 | * | 10/2002 | Hong et al. | ................. 257/410 |

* cited by examiner

*Primary Examiner*—George Fourson
(74) *Attorney, Agent, or Firm*—Hulsey Grether & Fortkort LLP; John A. Fortkort

(57) ABSTRACT

A compound semiconductor structure is provided, which includes a GaAs-based supporting semiconductor structure having a surface on which a dielectric material is to be formed. A first layer of gallium oxide is located on the surface of the supporting semiconductor structure to form an interface therewith. A second layer of a Ga—Gd oxide is disposed on the first layer. The GaAs-based supporting semiconductor structure may be a GaAs-based heterostructure such as an at least partially completed semiconductor device (e.g., a metal-oxide field effect transistor, a heterojunction bipolar transistor, or a semiconductor laser). In this manner a dielectric layer structure is provided which has both a low defect density at the oxide-GaAs interface and a low oxide leakage current density because the dielectric structure is formed from a layer of $Ga_2O_3$ followed by a layer of Ga—Gd-oxide. The $Ga_2O_3$ layer is used to form a high quality interface with the GaAs-based supporting semiconductor structure while the Ga—Gd-oxide provides a low oxide leakage current density.

17 Claims, 1 Drawing Sheet

METHOD OF FORMING ARTICLE COMPRISING AN OXIDE LAYER ON A GAAS-BASED SEMICONDUCTOR STRUCTURE

GORVERNMENT RIGHTS

This invention was made with Government support under Subcontract/Purchase Order No. 025307 awarded by the University of Southern Calif. (Prime Contract MDA904-93-C-L042). The Government has certain rights in this invention.

FIELD OF THE INVENTION

The present invention relates generally to articles that include dielectric oxide layers formed on a GaAs-based semiconductor structure.

BACKGROUND OF THE INVENTION

In the semiconductor art it is often desirable to form dielectric layers or films on various supporting structures, such as the gate insulator in field effect transistors, an insulator or passivation layer covering various areas (e.g. the extrinsic base region) of other types of transistors, such as HBTs and the like, an insulator or passivation layer surrounding the mesa or walls of a vertical cavity surface emitting laser or edge emitting lasers, etc. Regardless of the use, it is generally imperative that the dielectric layer or film be a good insulator with low defect density to enable device operation and enhance/maintain device performance. Also, the thickness of the layer must be sufficient to provide the required characteristics of the semiconductor devices, e.g. leakage current, reliability, etc.

Due to a lack of insulating layers having low interface state density and stable device operation on gallium arsenide (GaAs) based semiconductors, the performance, integration level and marketability of both digital and analog GaAs based devices and circuits is significantly limited. As is known in the art, growing oxide films by oxidizing GaAs based materials results in high interface state density and a Fermi level which is pinned at the GaAs-oxide interface.

A method of forming a thin film of $Ga_2O_3$ is disclosed, for example, in M. Passlack et al., Journal of Vacuum Science &Technology, vol. 17, 49 (1999), and U.S. Pat. Nos. 6,030,453 and 6,094,295. As discussed in these references, a high quality $Ga_2O_3$/GaAs interface is fabricated using in situ deposition of gallium oxide molecules on GaAs based epitaxial layers while maintaining an ultra-high vacuum (UHV). The thus fabricated $Ga_2O_3$-GaAs interfaces have interface recombination velocities S of 5,000–30,000 cm/s and interface state densities $D_{it}$ as low as $3.5\times10^{10}$ cm$^{-2}$ eV$^{-1}$. However, the properties of gallium oxides fabricated by this technique are inadequate for many applications because of high oxide bulk trap densities and excessive leakage current. Consequently, the performance of unipolar and bipolar devices is affected and the fabrication of stable and reliable metal-oxide-semiconductor field effect transistors (MOSFET) based on compound semiconductors has been problematic.

As discussed in U.S. Pat. No. 6,159,834, it has been determined that the aforementioned technique does not produce a high quality $Ga_2O_3$ layer because of oxygen vacancies in the layer that give rise to defects that cause unacceptable oxide trap densities. The '834 patent overcomes this problem by directing a molecular beam of gallium oxide onto the surface of the wafer structure to initiate the oxide deposition, and a second beam of atomic oxygen is supplied upon completion of the first 1-2 monolayers of $Ga_2O_3$. The molecular beam of gallium oxide is provided by thermal evaporation from a crystalline $Ga_2O_3$ or gallate source, and the atomic beam of oxygen is provided by any one of RF or microwave plasma discharge, thermal dissociation, or a neutral electron stimulated desorption atom source. This fabrication technique increases the quality of the $Ga_2O_3$ layer by reducing the density of oxygen related oxide defects while maintaining the excellent quality of the $Ga_2O_3$-GaAs interface. However, oxide bulk trap densities are still unacceptably high and significant leakage current is observed.

As an alternative to $Ga_2O_3$, gadolinium gallium oxides $(Ga_2O_3(Gd_2O_3))$ have been employed as a dielectric layer on GaAs-based devices. While this oxide layer has an acceptably low leakage current density, $Ga_2O_3(Gd_2O_3)$-GaAs interface state densities are relatively high, resulting in unacceptable device performance.

Accordingly, it would be desirable to provide a dielectric layer structure on GaAs-based devices that has both a low defect density oxide-GaAs interface and a low oxide leakage current density.

SUMMARY OF THE INVENTION

The present invention provides, among other things, a new and improved method of manufacturing a gate quality $Ga_2O_3$-compound semiconductor structure. The present invention also provides a new and improved method of manufacturing a gate quality $Ga_2O_3$-compound semiconductor structure wherein the density of defects related to oxygen vacancies is adequate for MOSFET applications.

In accordance with one embodiment of the invention, a compound semiconductor structure is provided, which includes a GaAs-based supporting semiconductor structure. A first layer of gallium oxide is located on a surface of the supporting semiconductor structure to form an interface therewith. A second layer of a Ga—Gd oxide is disposed on the first layer.

In one particular embodiment of the invention, the Ga—Gd oxide is $Gd_3Ga_5O_{12}$.

In another embodiment of the invention the GaAs-based supporting semiconductor structure is a GaAs-based heterostructure such as an at least partially completed semiconductor device. In some embodiments of the invention, the partially completed semiconductor device may be, for example, a metal-oxide field effect transistor, a heterojunction bipolar transistor, or a semiconductor laser.

In accordance with another embodiment of the invention, a method is provided of forming a dielectric layer structure on a supporting semiconductor structure. The method begins by providing a GaAs-based supporting semiconductor structure having a surface on which the dielectric layer structure is to be located. A first layer of $Ga_2O_3$ is deposited on the surface of the supporting structure. A second layer of a Ga—Gd-oxide is deposited on the first layer. In this manner a dielectric layer structure is provided which has both a low defect density at the oxide-GaAs interface and a low oxide leakage current density because the dielectric structure is formed from a layer of $Ga_2O_3$ followed by a layer of Ga—Gd-oxide. The $Ga_2O_3$ layer is used to form a high quality interface with the GaAs-based supporting semiconductor structure while the Ga—Gd-oxide provides a low oxide leakage current density.

DETAILED DESCRIPTION

The present inventors have surprisingly determined that a high quality, low defect dielectric layer structure can be formed from a gallium-oxide/GaAs interface followed by a Ga—Gd oxide layer. In contrast, prior art dielectric layers have been composed of either a gallium-oxide/GaAs interface or a Ga—Gd oxide/GaAs interface.

Figure 1:
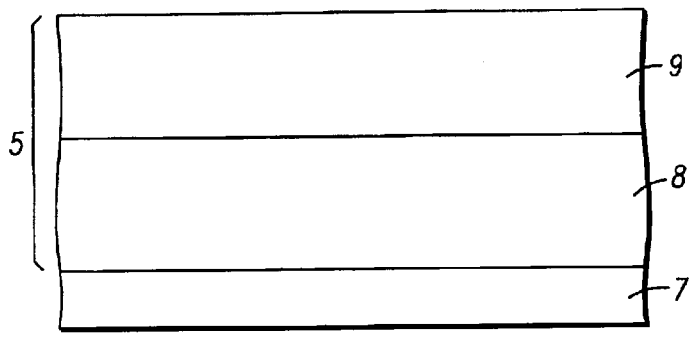
FIG. 1 is a simplified sectional view of a partial semiconductor structure with a composite dielectric layer structure deposited thereon in accordance with the present invention.

Referring specifically to FIG. 1 a simplified sectional view of a partial semiconductor structure is illustrated with a dielectric layer structure deposited thereon in accordance with the present invention. The partial semiconductor structure includes a GaAs-based supporting semiconductor structure 7, illustrated for simplicity as a single layer. Basically, structure 7 includes any semiconductor substrate, epilayers, heterostructures or combinations thereof having a surface to be coated with the dielectric layer structure. In general, the substrate is GaAs or a GaAs based material (II–V material) and the epilayers are GaAs based material epitaxially grown on the substrate in any of the well known processes.

The composite dielectric structure 5 includes a first layer 8 formed on the surface of supporting semiconductor structure 7 and a second layer 9 formed on layer 8. As will be explained presently, layer 8 is formed by depositing a layer of $Ga_2O_3$ on the surface of supporting semiconductor structure 7. Layer 8 provides a low interface state density on the GaAs-based supporting semiconductor structure 7. A second layer of material (layer 9) with low bulk trap density relative to the $Ga_2O_3$ is then deposited on the layer 8 to form the composite dielectric structure 5.

The composite dielectric structure 5 may be formed at any convenient time during the fabrication process and may, for example, be formed in situ in the growth chamber after the epitaxial growth of any or all layers included in structure 7. $Ga_2O_3$ layer 8 may be formed by any of a variety of techniques that are available to those of ordinary skill in the art. For example, $Ga_2O_3$ layer 8 may be formed by thermal evaporation of crystalline $Ga_2O_3$ or gallate under UHV conditions as discussed, for example in U.S. Pat. Nos. 6,030,453, 6,094,295, and 6,159,834. Alternatively, $Ga_2O_3$ layer 8 may be formed by other appropriate techniques that are known in the art such as by providing a high purity single crystal source of a specifically chosen material and evaporating the source by one of thermal evaporation, electron beam evaporation, and laser ablation. As previously mentioned, when a dielectric layer consisting only of $Ga_2O_3$ is formed on a GaAs-based material, the oxide bulk trap density is unacceptably high. To overcome this problem, in the present invention $Ga_2O_3$ layer 8 is only sufficiently thick to substantially cover the GaAs surface and to prevent Gd from a subsequently formed layer 9 from diffusing to the GaAs-$Ga_2O_3$ interface. Generally, the minimum thickness of layer 8 is determined by the thermodynamic stability requirements of the entire structure. The allowable maximum thickness of layer 8 is determined by the bulk trap distribution and density as well as semiconductor device performance requirements. For example, in some embodiments of the invention $Ga_2O_3$ layer 8 is formed with a thickness generally in the range of 0.5 nm to 10 nm and more preferably in the range of 2–5 nm.

As previously mentioned, once $Ga_2O_3$ layer 8 has been formed, layer 9 is then deposited on $Ga_2O_3$ layer 8 to complete the composite dielectric structure 5. Layer 9 is formed of a material with low bulk trap density relative to $Ga_2O_3$. In particular, in accordance with the present invention, layer 9 is a Ga—Gd-oxide, which is a mixed oxide that contains Ga, Gd, and oxygen. In some specific embodiments of the invention the Ga—Gd-oxide is $Gd_3Ga_5O_{12}$. While not a limitation on the invention, it is currently believed that Gd is a stabilizer element for stabilizing Ga in the 3+ oxidation state. It will be understood that the requirement that, in mixed oxide films, Ga are substantially fully oxidized does not mean that 100% of all the Ga ions have to be in the 3+ ionization state. For instance, acceptable results may be obtained if 80% or more of all Ga is in the 3+ state. The minimum thickness of layer 9 is determined by semiconductor device performance requirements. In general, the thickness of layer 9 is in a range of approximately 2 nm to 1000 nm and more preferably in the range of 5–20 nm.

The present invention advantageously achieves a dielectric layer structure with both a low defect density at the oxide-GaAs interface and a low oxide leakage current density because the Ga—Gd-oxide is deposited on a $Ga_2O_3$ layer 8, which is first used to form a high quality interface with the GaAs-based supporting semiconductor structure. That is, the present invention employs a composite dielectric structure formed from a layer of $Ga_2O_3$ followed by a layer of Ga—Gd-oxide.

Figure 2:
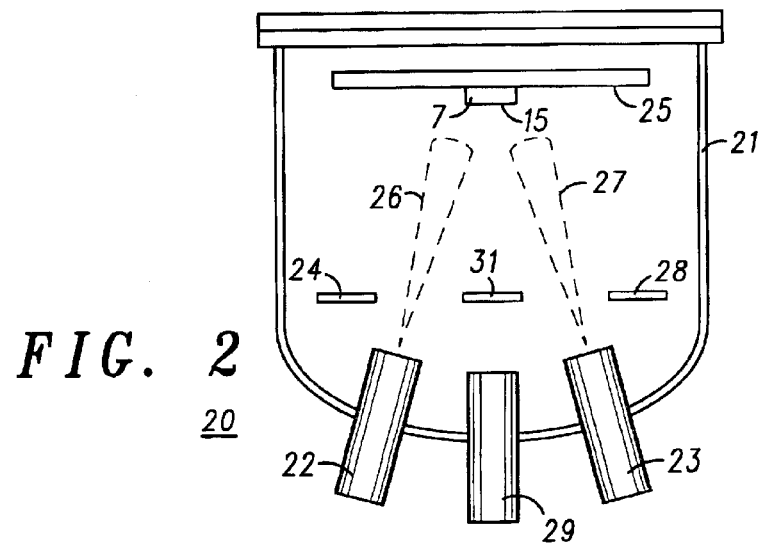
FIG. 2 illustrates an ultra high vacuum (UHV) molecular beam epitaxy system utilized in fabricating the structure of FIG. 1 in accordance with one embodiment of the present invention.

FIG. 2 illustrates an ultra high vacuum (UHV) molecular beam epitaxy (MBE) system utilized in fabricating the composite dielectric structure 5 of FIG. 1 in accordance with one embodiment of the present invention. System 20 includes a UHV chamber 21, high temperature effusion cells 22 and 29, a source 23 for atomic oxygen, cell shutters 24, 31 and 28, and a substrate holder 25 such as a platen. It will of course be understood that system 20 may allow the manufacture of a multiplicity of wafers simultaneously and/or includes other standard sources which are routinely used in MBE but which are not shown in FIG. 2, for instance effusion cells for Ga, As, Al, In, Ge etc.

In a specific embodiment that employs a Ga—Gd-oxide such as $Gd_3Ga_5O_{12}$ as the second layer 9 of the composite dielectric structure, a GaAs-based supporting semiconductor structure 7 with an atomically ordered and chemically clean upper surface 15 is mounted onto substrate holder 25 and loaded into UHV chamber 21. Subsequently, semiconductor structure 7 is heated to an appropriate elevated temperature in accordance with principles that are well-known to those of ordinary skill in the art. A crystalline $Ga_2O_3$ or gallate source is thermally evaporated using a high temperature effusion cell 22. The deposition of $Ga_2O_3$ molecules on the atomically ordered and chemically clean upper surface 15 of semiconductor structure 7 is initiated by opening the cell shutter 24 and providing a molecular beam of gallium oxide 26 directed onto upper surface 15, thus forming the initial gallium oxide layer on the substrate.

The quality of the initial gallium oxide layer may be enhanced by depositing atomic oxygen along with the gallium oxide to reduce oxygen vacancies that can give rise to defects. In particular, subsequent to the opening of cell shutter 24, a beam of atomic oxygen 27 is directed onto upper surface 15 of semiconductor structure 7 by opening the shutter 28 of atomic oxygen source 23. The shutter may be opened at any time during the initial $Ga_2O_3$ deposition, preferentially after 1–2 monolayers of $Ga_2O_3$ have been deposited since surface oxidation of GaAs needs to be completely eliminated for low interface state density of the $Ga_2O_3$-GaAs interface.

Next, the Ga—Gd-oxide layer is formed by depositing Gd while continuing to deposit the $Ga_2O_3$. A Gd source material such as $Gd_3Ga_5O_{12}$, preferably in a high purity, single-crystalline form, is thermally evaporated using high temperature effusion cell 29. The deposition of the Gd is initiated by opening cell shutter 31 at some time after the deposition of $Ga_2O_3$ begins. However, Gd deposition may begin before or subsequent to exposing semiconductor structure 7 to the beam of atomic oxygen. Those of ordinary skill in the art will recognize that the properties of the composite dielectric structure 5 formed on semiconductor structure 7 such as its stoichiometry can be controlled by adjusting the flux from the $Ga_2O_3$ effusion cell 22, the Gd effusion cell 29, and the atomic oxygen cell 23.

Figure 3:
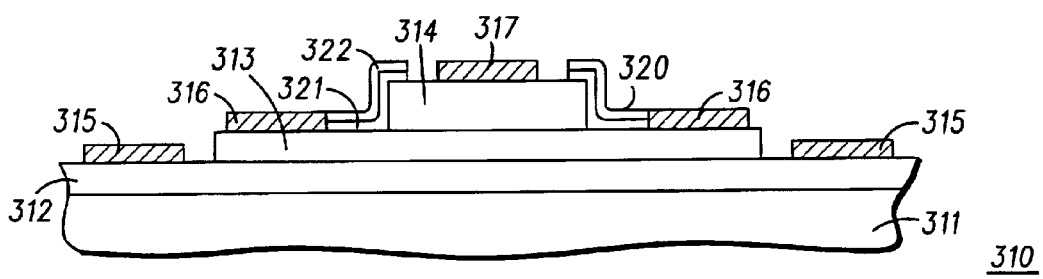
FIG. 3 is a simplified cross-sectional view of an HBT incorporating the present invention.
Figure 4:
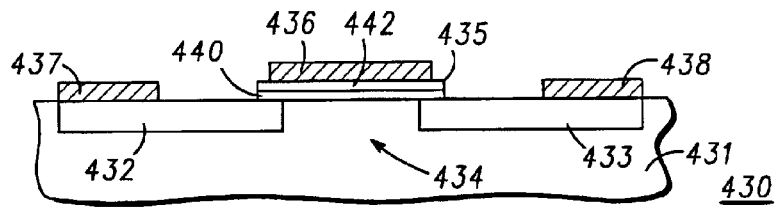
FIG. 4 is a simplified cross-sectional view of a metal-oxide semiconductor FET incorporating the present invention.

Specific examples of semiconductor devices incorporating the aforementioned dielectric layer structure are illustrated in FIGS. 3–4. Referring specifically to FIG. 3 a simplified cross-sectional view of a heterojunction bipolar transistor (HBT) 310 formed in accordance with the present invention is illustrated. In this simplified form, HBT 310 includes a substrate 311, a collector layer 312 formed (grown or otherwise deposited) on the upper surface of substrate 311, a base layer 313 formed on the upper surface of collector layer 312 and an emitter layer 314 formed on the upper surface of base layer 313. Collector contact or contacts 315 are formed on an upper surface of collector layer 312. Base contact or contacts 316 are formed on an upper surface of base layer 313. An emitter contact 317 is formed on an upper surface of emitter layer 314. All of the various layers and contacts are formed in a well known manner and may be formed in any sequence convenient to the specific device and fabrication technique being utilized. In general, substrate 311 is a GaAs-based material and all of the materials used in layers 312, 313 and 314 are in a similar material system so as to be crystalographically coupled. This is accomplished, as is known in the art, by epitaxially growing the various layers in sequence in a standard growth chamber.

A composite dielectric layer structure 320 is formed over exposed portions of emitter layer 314 and base layer 313 for purposes of passivation and to enhance device performance and stability. As explained above, dielectric layer structure 320 may be formed at any convenient time during the fabrication process following removal of native oxide under ultra-high vacuum conditions. Composite dielectric layer structure 320 includes a first layer 321 and a second layer 322. First layer 321 is a thin layer of $Ga_2O_3$ and corresponds to layer 8 of FIG. 1. Second layer 322 is a layer of Ga—Gd-oxide and corresponds to layer 9 of FIG. 1. First and second layers 321 and 322 are formed in accordance with the previously described process, typically after the formation of contacts 315 and 316. Composite dielectric layer structure 320 is generally formed with a thickness greater than about 50 angstroms and preferably in a range of approximately 70 angstroms to 250 angstroms.

FIG. 4 illustrates a simplified cross-sectional view of a semiconductor field effect transistor FET 430 constructed in accordance with the present invention. FET 430 includes a substrate 431 having heavily doped source and drain areas 432 and 433, respectively, formed therein with a channel area 434 therebetween. Substrate 431 is a GaAs based material. A composite dielectric layer structure 435 (generally referred to as a gate oxide) is formed over channel area 434 in accordance with the present invention. Dielectric layer structure 435 includes a first layer 440 of $Ga_2O_3$ and a second layer 442 of Ga—Gd-oxide. A gate metal contact 436 is formed on dielectric layer structure 435 in a usual procedure and source and drain contacts 437 and 438 are formed on source and drain areas 432 and 433, respectively.

It should be understood that the semiconductor devices depicted in FIGS. 3–4 are presented by way of illustration only and that the present invention is more generally applicable to a composite dielectric structure formed on a wide variety of different semiconductor devices such as semiconductor lasers and photosensitive devices, for example.

Although various embodiments are specifically illustrated and described herein, it will be appreciated that modifications and variations of the present invention are covered by the above teachings and are within the purview of the appended claims without departing from the spirit and intended scope of the invention.

What is claimed is:

1. A method of forming a dielectric layer structure on a semiconductor structure comprising the steps of:

providing a GaAs-based semiconductor structure;

depositing a first layer of gallium oxide on a surface of the structure through evaporation of a first source; and depositing a second layer of a Ga-Gd-oxide on the first layer through evaporation of a second source distinct from said first source, wherein the first source is crystalline $Ga^2O^3$ and the second source is a Gd source material, wherein the crystalline $Ga_2O_3$ is evaporated using a first of Ga-Gd-oxide high temperature effusion cell, and wherein the Gd source material is evaporated using a second high temperature effusion cell distinct from said first effusion cell.

2. The method of claim 1 further comprising the step of evaporating atomic oxygen during at least a portion of the step of depositing the layer of gallium oxide.

3. The method of claim 2 wherein evaporating atomic oxygen begins after at least one monolayer of gallium oxide has been deposited onto the surface of the semiconductor structure.

4. The method of claim 3 wherein evaporating atomic oxygen commences before evaporating the Gd source material.

5. The method of claim 3 wherein evaporating the Gd source material commences before evaporating atomic oxygen.

6. The method of claim 1 wherein the Ga-Gd oxide is $Gd_3Ga_5O_{12}$.

7. The method of claim 1 wherein the GaAs-based semiconductor structure is a GaAs-based heterostructure.

8. The method of claim 7 wherein the GaAs-based semiconductor structure is an at least partially completed metal-oxide field effect transistor.

9. The method of claim 7 wherein the GaAs-based semiconductor structure is an at least partially completed heterojunction bipolar transistor.

10. The method of claim 7 wherein the GaAs-based semiconductor structure is an at least partially completed semiconductor laser.

11. The method of claim 1 wherein the first layer of gallium oxide has a thickness in a range of approximately 0.5 nm to 10 nm.

12. The method of claim 1 wherein the second layer of Ga-Gd oxide has a thickness in a range of approximately 5 nm to 20 nm.

13. The method of claim 1, further comprising the step of depositing atomic oxygen during deposition of the first layer of gallium oxide.

14. The method of claim 13, wherein deposition of atomic oxygen is commenced immediately after formation of a monolayer of gallium oxide on a surface of the structure.

15. A method of forming a dielectric layer structure on a semiconductor surface, comprising the steps of:

provided an apparatus comprising a first high temperature effusion cell containing $Ga_2O_3$ and a second high temperature effusion cell containing a Gd source material of Ga-Gd-oxide;

evaporating $Ga_2O_3$ from the first cell onto a GaAs substrate, thereby forming a first dielectric layer on the substrate; and evaporating the Gd source material from the second cell onto the first dielectric layer, thereby forming a second dielectric layer comprising Ga-Gd-oxide.

16. The method of claim 15, further comprising the step of depositing atomic oxygen over the substrate concurrent with the formation of the first dielectric layer.

17. The method of claim 15, further comprising the step of depositing atomic oxygen over the substrate immediately after formation of a monolayer of gallium oxide on a surface of the structure.

* * * * *

UNITED STATES PATENT AND TRADEMARK OFFICE
CERTIFICATE OF CORRECTION

| | | |
|---|---|---|
| PATENT NO. | : 6,756,320 B2 | Page 1 of 1 |
| APPLICATION NO. | : 10/051494 | |
| DATED | : June 29, 2004 | |
| INVENTOR(S) | : Matthias Passlack et al. | |

It is certified that error appears in the above-identified patent and that said Letters Patent is hereby corrected as shown below:

In Column 6, Line 33, change "$Ga^2O^3$" to - -$Ga_2O_3$- -

In Column 6, Line 34, after "material" insert - -of Ga-Gd oxide- -

Signed and Sealed this

Fifth Day of September, 2006

JON W. DUDAS
*Director of the United States Patent and Trademark Office*